US011543362B2

(12) United States Patent
Song et al.

(10) Patent No.: US 11,543,362 B2
(45) Date of Patent: Jan. 3, 2023

(54) METHOD FOR MEASURING THE HEIGHTS OF WIRE INTERCONNECTIONS

(71) Applicant: ASMPT SINGAPORE PTE. LTD., Singapore (SG)

(72) Inventors: Keng Yew Song, Singapore (SG); Chi Kwan Park, Singapore (SG); Jiang Huang, Chengdu (CN); Ya Ping Zhu, Chengdu (CN); Mow Huat Goh, Singapore (SG)

(73) Assignee: ASMPT SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/848,919

(22) Filed: Apr. 15, 2020

(65) Prior Publication Data

US 2020/0348243 A1 Nov. 5, 2020

Related U.S. Application Data

(60) Provisional application No. 62/841,903, filed on May 2, 2019.

(51) Int. Cl.
*G01N 21/95* (2006.01)
*H01L 23/00* (2006.01)
*G01B 11/06* (2006.01)

(52) U.S. Cl.
CPC ......... *G01N 21/9501* (2013.01); *G01B 11/06* (2013.01); *H01L 24/14* (2013.01)

(58) Field of Classification Search
CPC ...... G01B 11/06; G01B 7/02; G01N 21/9501; G01N 21/95684; H01L 24/14; H01L 22/12; H01L 22/20; H01L 24/78

(Continued)

(56) References Cited

U.S. PATENT DOCUMENTS 6,933,223 B1 * 8/2005 Soon .................... B23K 20/004
438/617
2012/0211855 A1 * 8/2012 Iwafuchi ................. H01L 24/78
257/E31.113

(Continued)

FOREIGN PATENT DOCUMENTS

KR 10-0129946 B1 4/1998
KR 10-2009-0053142 A 5/2009
WO WO 2009/002345 A1 12/2008

OTHER PUBLICATIONS

Korean Notice of Preliminary Rejection, dated Jun. 18, 2021, issued in corresponding Korean Patent Application No. 10-2020-0048563. English translation. Total 8 pages.

(Continued)

*Primary Examiner* — Tri T Ton
(74) *Attorney, Agent, or Firm* — Ostrolenk Faber LLP

(57) ABSTRACT

A height of a vertical wire interconnection bonded onto a substrate is measured by first capturing a top view of the vertical wire interconnection and identifying a position of a tip end of the vertical wire interconnection from the top view. A conductive probe is located over the tip end of the vertical wire interconnection, and is lowered towards the vertical wire interconnection until an electrical connection is made between the conductive probe and the tip end of the vertical wire interconnection. A contact height at which the electrical connection is made may thus be determined, wherein the contact height corresponds to the height of the vertical wire interconnection.

10 Claims, 4 Drawing Sheets

(58) Field of Classification Search
USPC ............ 356/356, 237.1–237.6, 239.1–239.8
See application file for complete search history.

(56) References Cited

U.S. PATENT DOCUMENTS

2019/0246492 A1* 8/2019 Choi .................... H05K 1/0216
2019/0287941 A1* 9/2019 Maruya ................. H01L 22/12

OTHER PUBLICATIONS

Korean Notice of Preliminary Rejection, dated Feb. 15, 2022, issued in corresponding Korean Patent Application No. 10-2020-0048563. English translation. Total 8 pages.

* cited by examiner

METHOD FOR MEASURING THE HEIGHTS OF WIRE INTERCONNECTIONS

FIELD OF THE INVENTION

The invention relates to a method for measuring the heights of wire interconnections made on semiconductor devices and other substrates, and in particular vertically-oriented wire interconnections.

BACKGROUND

Bond Via Array (BVA) or vertically-oriented wire interconnections are formed on semiconductor substrates, such as semiconductor wafers, semiconductor dice or lead frames. BVA or vertically oriented wire interconnections may be used in various applications, for instance, electromagnetic interference (EMI) shielding or connecting a lower substrate to an upper substrate.

The BVA or vertically oriented wire interconnections may be formed with a wire bonding apparatus. A bonding wire from a wire reel is supplied to a capillary of the wire bonding device, and a free end of the bonding wire moves together with the capillary. A free air ball (FAB) is formed at the free end of the bonding wire that is positionable by the capillary. The capillary bonds the FAB to a bonding position, which may be a bond pad on a semiconductor die or any desired location on a substrate or wafer, thus forming a ball bond. Thereafter, the capillary moves vertically upwards to feed out a length of wire from the capillary. After a certain length of bonding wire is fed out from the capillary, the bonding wire is broken and connected to the ball bond, thus leaving a vertically oriented length of wire extending from the bond pad. In this manner, a vertically-oriented wire interconnection is formed. This process is repeated at other desired locations where vertical wires are required.

Subsequently, the wafer or substrate is visually inspected by an operator using a microscope to detect any defects or irregularities, for example whether any wire interconnection is deformed. However, such manual visual inspection is not precise and human error makes the inspection process inconsistent and highly dependent on the competence of the operator. Therefore, it is desirable to provide an improved method of inspecting BVA or vertically oriented wire interconnections formed.

Moreover, it would be advantageous during such inspection to measure the heights of these wire interconnections to ensure that they are within an acceptable range.

SUMMARY OF THE INVENTION

It is thus an object of the invention to seek to provide a method of inspecting BVA or vertically oriented wire interconnections formed on a substrate.

Accordingly, the invention provides a method of measuring a height of a vertical wire interconnection bonded onto a substrate, the method comprising the steps of: capturing a top view of the vertical wire interconnection; identifying a position of a tip end of the vertical wire interconnection from the top view; locating a conductive probe over the tip end of the vertical wire interconnection, and lowering the conductive probe towards the vertical wire interconnection until an electrical connection is made between the conductive probe and the tip end of the vertical wire interconnection; and determining a contact height at which the electrical connection is made, the contact height corresponding to the height of the vertical wire interconnection.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENT OF THE INVENTION

Figure 1:
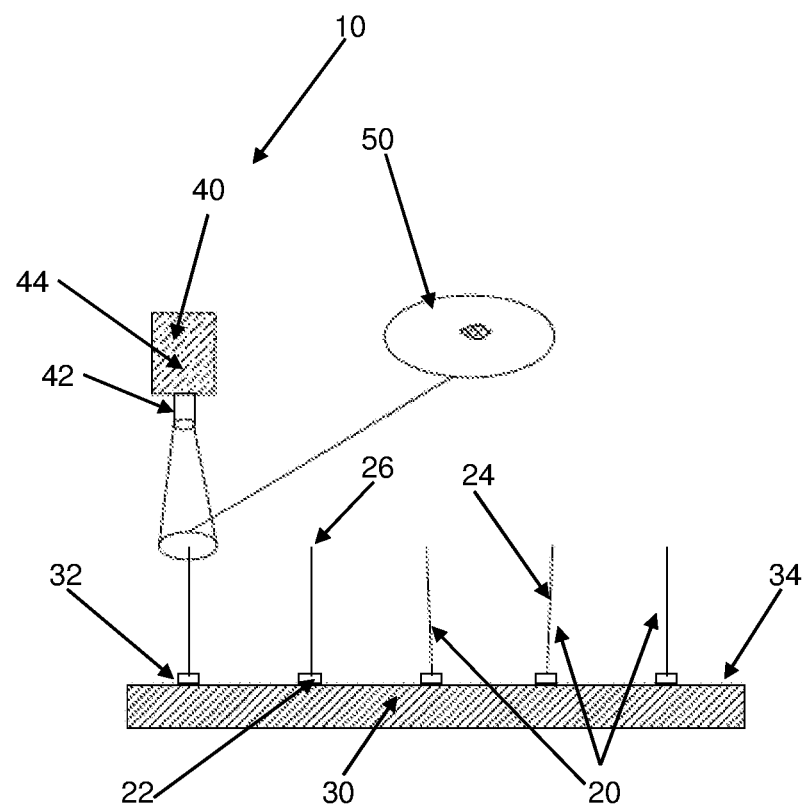
FIG. 1 illustrates a visual inspection apparatus for inspecting the structure of vertical wire interconnections according to the preferred embodiment of the invention.

FIG. 1 illustrates a visual inspection apparatus 10 for inspecting the structure of vertical wire interconnections 20 according to the preferred embodiment of the invention. The vertical wire interconnections 20 or BVA are formed on a substrate 30, such as a semiconductor die, a wafer or a lead frame.

Each vertical wire interconnection 20 comprises a ball bond 22 formed on a respective bonding location 32, such as a bond pad, on the substrate 30. Each vertical wire interconnection 20 also comprises a corresponding vertical wire portion 24 that extends vertically upwards from the ball bond 22 and terminates at a wire tip end or free end 26. Ideally, the vertical wire portions 24 are straight and perpendicular to a planar surface 34 of the substrate 30, but some vertical wire portions 24 might be slanted and deviate from the vertical. These slanted vertical wire portions 24 are anomalies and should be detected to determine whether these are within specified manufacturing tolerances.

The visual inspection apparatus 10 comprises an optical system 40 comprising a camera 42 and a processor 44. The optical system 40 is positionable directly above the substrate 30 and may be movable relative to the substrate 30 in the X and Y axes on a horizontal plane, such horizontal plane being generally parallel to the planar surface of the substrate 30. It should be appreciated that either the optical system 40 may be configured to move, the substrate 30 may be configured to move, or both the optical system 40 and the substrate 30 may be configured to move. The camera 42 is directed downwards towards the planar surface 34 of the substrate 30, and captures top-view images 50 of the vertical wire interconnections 20.

Figure 2:
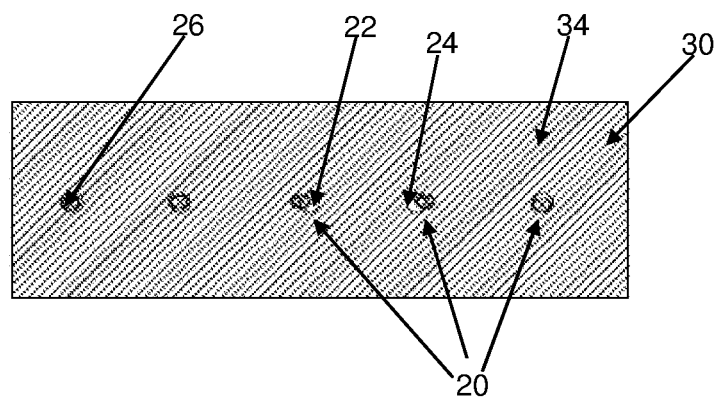
FIG. 2 is a plan view of a substrate on which vertical wire interconnections have been formed on a planar surface of the substrate.

FIG. 2 is a plan view of the substrate 30 on which vertical wire interconnections 20 have been formed on the planar surface 34 of the substrate 30. As illustrated in FIG. 2, the free ends 26 may be offset from the ball bonds 22. If the vertical portion 24 were absolutely vertical, the free end 26 would be aligned with the vertical portion 24 and the ball bond 22.

Locations of a plurality of vertical wire interconnections 20 that have been bonded onto the substrate 30 should first be determined by the visual inspection apparatus 10. The processor 44 may be provided with the XY coordinates of all the vertical wire interconnections 20 to be inspected by the optical system 40 prior to the start of the inspection process. Alternatively, the camera 42 may be moved over the planar surface 34 of the substrate 30 to detect, recognize and inspect every vertical wire interconnection 20. In both cases, the optical system 40 sends the images 50 captured to the processor 44, which determines the XY coordinates of the ball bond 22 (X0, Y0) and the XY coordinates of the free end 26 (X1, Y1) of each wire interconnection 20 from the images 50. Then, the processor 44 calculates a wire tip offset or a difference between the XY coordinates of the ball bond 22 and the XY coordinates of the free end 26 (X1-X0, Y1-Y0). Accordingly, the wire tip offset represents a difference between a position of the ball bond 22 on a first horizontal plane, and a position of the free end 26 of the vertical wire interconnection 20 on a second horizontal plane parallel to the first horizontal plane.

From this difference or wire tip offset, the processor 44 is able to determine how much the vertical wire portion 24 has deviated from the vertical. Ideally, the difference is zero, which means that the vertical wire portion 24 is exactly perpendicular to the planar surface 34 (X0=X1, Y0=Y1). Although there may be a difference, as long as the difference is lower than a specified manufacturing tolerance, the deviation from the exact or absolute vertical would still be accepted as a manufacturing variation. However, if the difference is higher than the specified manufacturing tolerance, the deviation would be unacceptable and the vertical wire interconnection 20 would be identified as a manufacturing defect.

Hence, the visual inspection apparatus 10 provides an automated, accurate, repeatable and objective inspection method for inspecting whether the vertical wire interconnections 20 are perpendicular to the planar surface 34 of the substrate 30. Indeed, the deviations are commonly merely a few micrometers and may be a few orders of magnitude smaller, and are imperceptible to the human eye.

Figure 3A:
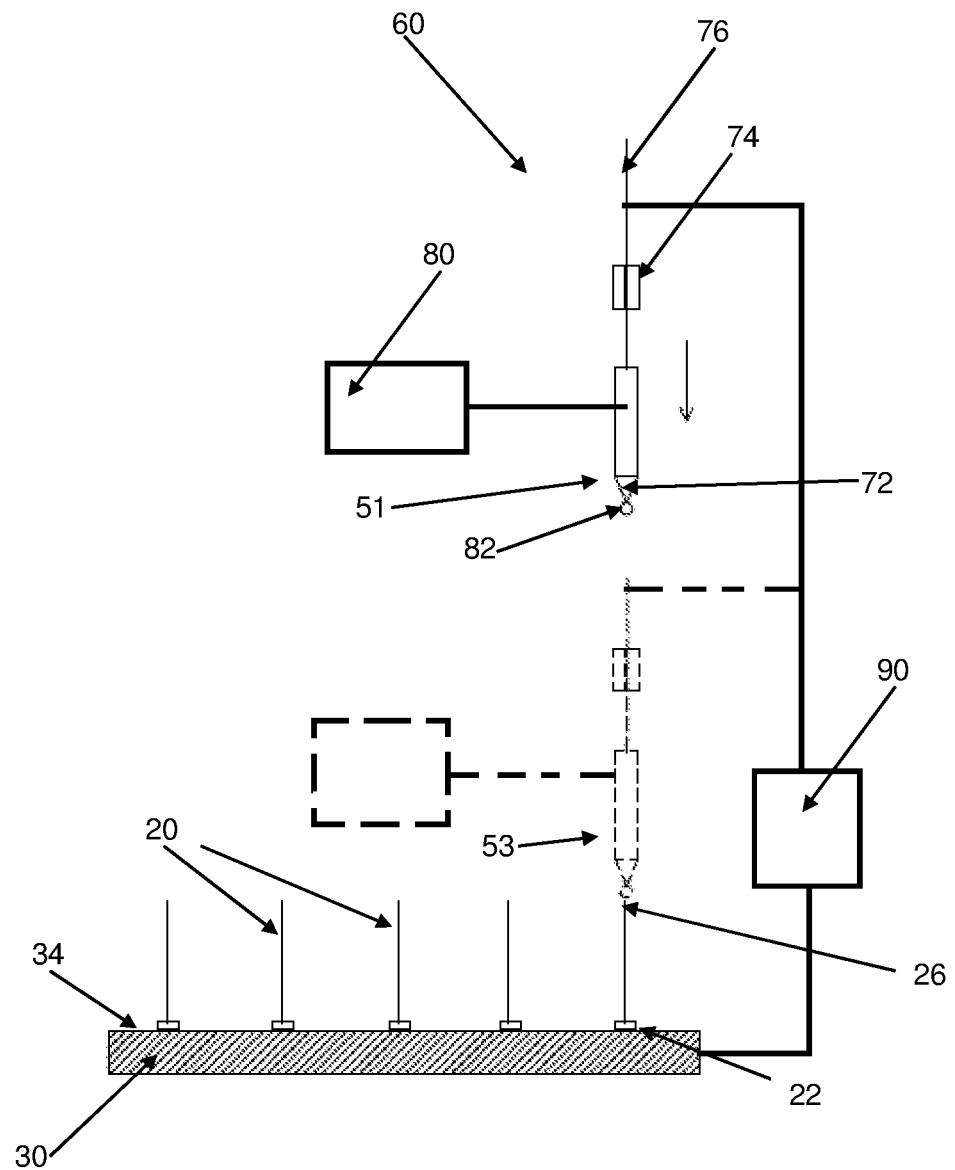
FIGS. 3A and 3B illustrate a height measurement approach for inspecting respective heights of the vertical wire interconnections according to the preferred embodiment of the invention.
Figure 3B:
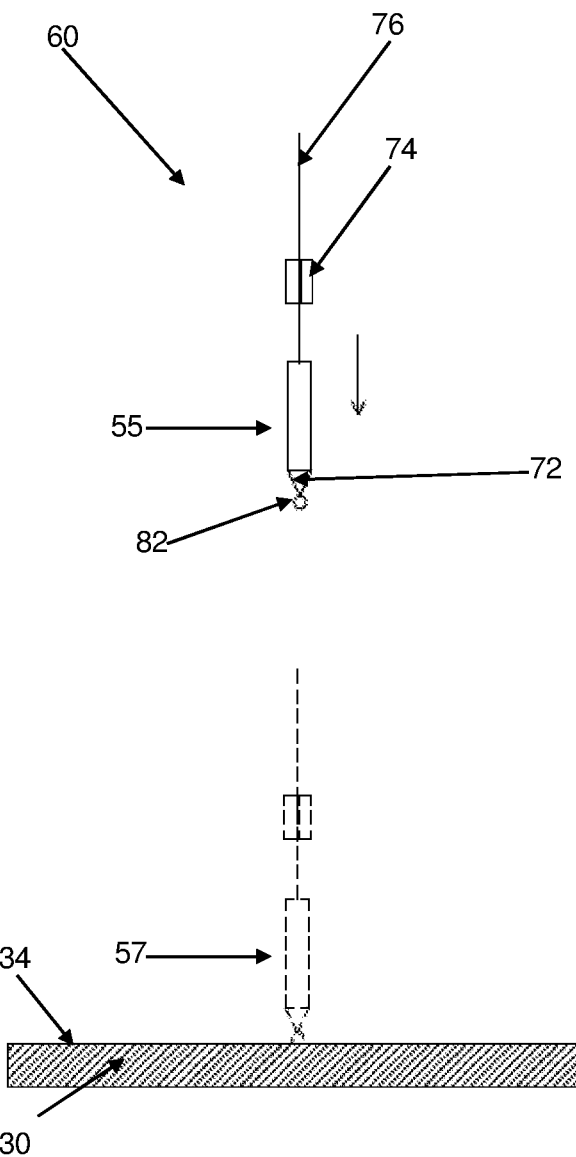

FIGS. 3A and 3B illustrate a height measurement approach for inspecting the heights of the vertical wire interconnections 20 according to the preferred embodiment of the invention. A bonding apparatus 60 comprises a wire clamp 74 and a bond head comprising a capillary 72. A length of bonding wire 76 is supplied from a wire reel (not shown) to the capillary 72 through the wire clamp 74 and the capillary 72. The bonding wire 76 may pass freely through the capillary 72 so as to extend from a base of the capillary 72. The capillary 72 and the wire clamp 74 are movable in the XYZ axes, and an encoder 80 is operatively connected to the bond head for detecting the movement of the bond head and capillary 72. The bonding apparatus 60 is operative to bond the vertical wire interconnections 20 onto the substrate 30 prior to inspection of the said vertical wire interconnections 20.

In this embodiment, the bonding wire 76 forms a conductive probe. Hence, the bonding apparatus 60 further comprises a contact detection device 90 for detecting any electrical contact between the bonding wire 76 and the vertical wire interconnections 20. The contact detection device 90 is electrically connected to both the substrate 30 and the bonding wire 76, such that when the bonding wire 76 contacts a vertical wire interconnection 20, a closed circuit is formed in which an electrical current may flow. Alternatively, another conductive probe that is independent of the bonding apparatus 60 may also be adopted for performing height measurement.

As shown in FIG. 3A, an FAB 82 is first formed at a free end of the bonding wire 76 at the capillary 72. The diameter of the FAB 82 may vary widely, but is generally between about 1 and 5 times the diameter of the bonding wire 76. One advantage of utilizing an FAB 82, which has a larger diameter than the bonding wire 76, is that a larger contact area is provided for contacting the vertical wire interconnections 20. Hence, it facilitates the establishment of contact between the FAB 82 and the free ends 26 of the vertical wire interconnections 20 when inspecting or measuring the heights of the vertical wire interconnections 20.

Then, the capillary 72 is moved together with the wire clamp 74, which is clamping onto the bonding wire 76, along the XY axes or the horizontal plane to a first initial search position 51 that is above a vertical wire interconnection 20 based on the XY coordinates of a free end 26 (X1, Y1) of a particular vertical wire interconnection 20 to be measured as determined by the optical system 40. Subsequently, the capillary 72 and the wire clamp 74 are moved downwards towards the free end 26 of the vertical wire interconnection 20, as the encoder 80 continuously detects the height (Z coordinate) of the capillary 72. The speed of descent of the capillary 72 may be reduced as the capillary 72 approaches the expected height (Z coordinate) of the vertical wire interconnection 20 for initiating contact therebetween.

Once the FAB 82 contacts the free end 26 of the vertical wire interconnection 20 at an interconnection contact position 53, an electrical connection is established between the FAB 82 and the free end of the vertical wire interconnection 20, and a closed circuit is formed. At this point, the contact detection device 90 determines that there has been contact. Whilst the bigger diameter of the FAB 82 makes it easier for the FAB 82 to establish contact with the free end 26 of the vertical wire interconnection 20, it should be appreciated that an FAB is not strictly necessary for implementing the method. The capillary 72 and the wire clamp 74 stop moving as soon as the contact is detected, and the encoder 80 records the height H1 (which is a Z coordinate) of this interconnection contact position 53.

Next, the capillary 72 and the wire clamp 74 move upwards to remove the contact between the FAB 82 and the free end 26 of the vertical wire interconnection 20. Then, the capillary 72 and the wire clamp 74 are moved laterally along the XY axes to a second initial search position 55, at another XY location. This process may be repeated for all the vertical wire interconnection 20 on the substrate 30.

As shown in FIG. 3B, the second initial search position 55 is directly above the planar surface 34 without any obstacles in between. The second initial search position 55 may be any location next to the interconnection contact position 53 according to a plan view or a specially reserved location on the planar surface 34 for determining a substrate height H0 (which is a Z coordinate) of the planar surface 34. At the second initial search position 55, the capillary 72 and the wire clamp 74 move downwards towards the planar surface 34 of the substrate 30, as the encoder 80 continuously detects the height of the capillary 72. The speed of descent of the capillary 72 may be reduced as the capillary 72 approaches the expected height (Z coordinate) of the planar surface 34 of the substrate 30.

When the FAB 82 contacts the planar surface 34 at a substrate contact position 57, an electrical connection is made and a closed circuit path is formed, thus the contact detection device 90 detects the contact. The capillary 72 and the wire clamp 74 stop moving as soon as the contact is detected, and the encoder 80 records the substrate height H0 (Z coordinate) of this substrate contact position 57. A substrate contact height which corresponds to a height of the substrate 30 is thus determined.

The bonding apparatus 60 may then determine the actual vertical height (H1–H0) of the vertical wire interconnection 20 by calculating the difference between the wire height H1 and the substrate height H0. Hence, the bonding apparatus 60 provides an automated, accurate, repeatable and objective method for inspecting or measuring the heights of the vertical wire interconnections 20.

Figure 4:
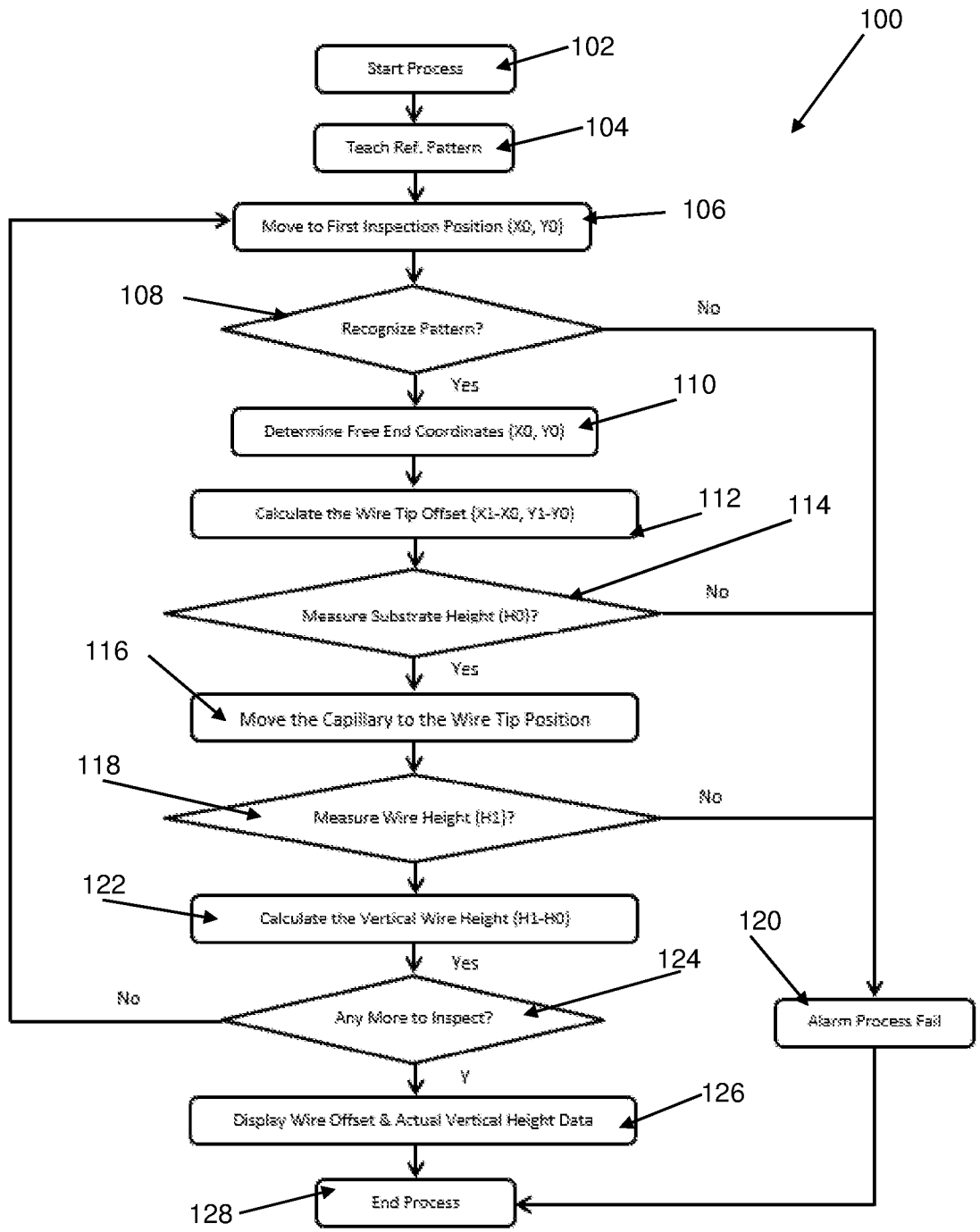
FIG. 4 is a flowchart of a process flow for inspecting the wire interconnections using an inspection device according to the preferred embodiment of the invention.

FIG. 4 is a flowchart 100 of a process flow for inspecting the wire interconnections 20 using the bonding apparatus 60, which comprises the visual inspection apparatus 10, according to the preferred embodiment of the invention.

After the wire interconnection inspection process is started (step 102), the optical system 40 is moved to a reference position for capturing images of a reference pattern of a vertical wire interconnection 20 to teach the optical system 40 to recognize the shapes of various vertical wire interconnections 20 (step 104). The reference position may be any appropriate position, for instance, the XY coordinates of a ball bond 22 of a first vertical wire interconnection 20 (X0, Y0). The reference pattern may also be any suitable pattern, for example, a dummy pattern or an actual vertical wire interconnection 20.

Then at step 106, the optical system 40 moves to the XY coordinates of the ball bond 22 of the first vertical wire interconnection 20 (X0, Y0). The camera 42 of the optical system 40 captures a top-view image of the first vertical wire interconnection 20 and the optical system 40 performs a pattern recognition process to recognize and detect the first vertical wire interconnection 20 (step 108). If the optical system 40 fails to recognize the first vertical wire interconnection 20, an alarm is raised (step 120). Otherwise, at step 110, the optical system determines the XY coordinates of the tip or free end 26 (X1, Y1) of the first vertical wire interconnection 20. Next, at step 112, the processor 44 calculates a wire tip offset or a difference between the XY coordinates of the ball bond 22 and the XY coordinates of the free end 26 (X1-X0, Y1-Y0) of the first vertical wire interconnection 20.

Thereafter, at step 114, the bonding apparatus 60 forms an FAB 82 at the capillary 72, and moves the capillary 72 to a second initial search position 55 and subsequently moves downwards to contact the planar surface 34 at a substrate contact position 57, and the encoder 80 records a substrate height (H0) at the substrate contact position 57. Subsequently, the capillary is moved to the first inspection position or the wire tip position at the XY coordinates of the free end 26 (X1, Y1) of the first vertical wire interconnection 20 (step 116). The capillary 72 is then moved downwards until contact is established between the FAB 82 and the free end 26 at an interconnection contact position 53, and the encoder 80 records a wire height (H1) at the interconnection contact position 53 (step 116). It should be noted that step 114 is an optional step, which may be skipped if the substrate height (H0) is already known, for instance, from a previous substrate height (H0) measurement step. If the bonding apparatus 60 fails to measure either the wire height (H1) or the substrate height (H0), an alarm would be activated (step 120). Moreover, step 118 may be performed before step 114. Hence, the wire height (H1) may be measured (step 118) prior to measuring the substrate height (H0) (step 116).

At step 122, the bonding apparatus 60 calculates the actual vertical height (H1–H0) of the first vertical wire interconnection 20 by calculating the difference between the wire height H1 (Z coordinate) and the substrate height H0 (Z coordinate). Then, at step 124, it is determined whether there are more vertical wire interconnections 20 to be inspected. If there are no more vertical wire interconnections 20 to be inspected, the wire tip offset and the actual vertical height (H1–H0) would be displayed (step 126) before the process terminates (step 128). However, if there are more vertical wire interconnections 20 to be inspected, the process would return to step 106 to inspect a second and subsequent vertical wire interconnections 20. In the event that the substrate height H0 (Z coordinate) is already known, for instance, from the previous step 114 carried out on the first vertical wire interconnection 20, step 114 to measure the substrate height H0 for the second and subsequent vertical wire interconnections 20 may be skipped.

One advantage of using a bonding apparatus 60 to inspect the heights of vertical wire interconnections 20 is that the same apparatus may be used both to form the vertical wire interconnections 20 and to inspect the heights of the vertical wire interconnections 20. Since no additional component is required to perform the two separate functions, the method according to the preferred embodiment of the invention makes the inspection process more economical and convenient. However, any appropriate conductive structure, such as a conductive probe, may be used instead, for establishing contact with the vertical wire interconnections 20 and the planar surface 34 in order to measure the actual vertical heights (H1–H0) of the vertical wire interconnections 20.

Although the present invention has been described in considerable detail with reference to certain embodiments, other embodiments are possible.

For example, instead of an FAB 82, a free end of the bonding wire 76 could be used to establish contact with the free end 26 of the vertical wire interconnections 20 without forming an FAB 82.

Therefore, the spirit and scope of the appended claims should not be limited to the description of the embodiments contained herein.

The invention claimed is:

1. A method of measuring a height of a vertical wire interconnection bonded onto a substrate, the method comprising the steps of:
   capturing a top view of the vertical wire interconnection with an optical system;
   identifying a position of a tip end of the vertical wire interconnection from the top view;
   locating a conductive probe over the tip end of the vertical wire interconnection, and lowering the conductive probe towards the vertical wire interconnection until an electrical connection is made between the conductive probe and the tip end of the vertical wire interconnection; and
   determining a height of the vertical wire interconnection which has been bonded onto the substrate by determining a contact height at which the electrical connection is made,
   wherein the vertical wire interconnection comprises a ball bond formed on the substrate, and a vertical wire portion that extends vertically upwards from the ball bond and terminates at the tip end of the vertical wire interconnection,
   wherein the optical system is positionable directly above the substrate, and movable relative to the substrate on a horizontal plane that is generally parallel to a planar surface of the substrate.

2. The method as claimed in claim 1, wherein the vertical wire portion is straight and substantially perpendicular to a planar surface of the substrate.

3. The method as claimed in claim 1, further comprising the step of calculating an offset between a position of the ball bond on a first horizontal plane and a position of the tip end of the vertical wire interconnection on a second horizontal plane parallel to the first horizontal plane.

4. The method as claimed in claim 3, further comprising the step of determining whether the offset is higher than a specified manufacturing tolerance, and if so, identifying the vertical wire interconnection as a manufacturing defect.

5. The method as claimed in claim 1, further comprising the step of determining locations of a plurality of vertical wire interconnections that have been bonded onto the substrate, prior to capturing a top view of the substrate comprising each of the plurality of vertical wire interconnections.

6. The method as claimed in claim 1, wherein the conductive probe comprises bonding wire extending from a capillary of a bonding apparatus, the bonding apparatus being operative to bond vertical wire interconnections onto the substrate and further comprises a contact detection device for detecting electrical contact between the bonding wire and the vertical wire interconnection.

7. The method as claimed in claim 6, further comprising the step of forming a free air ball at a free end of the bonding wire prior to lowering the bonding wire towards the vertical wire interconnection, whereby the electrical connection is made between the free air ball on the bonding wire and the tip end of the vertical wire interconnection.

8. The method as claimed in claim 7, wherein a diameter of the free air ball is larger than a diameter of the bonding wire, and is up to 5 times of the diameter of the bonding wire.

9. The method as claimed in claim 1, further comprising the steps of:
   locating the conductive probe above a planar surface of the substrate without any obstacles in between;
   lowering the conductive probe towards the substrate until an electrical connection is made between the conductive probe and the substrate; and
   determining a substrate contact height at which the electrical connection is made, the substrate contact height corresponding to a height of the substrate.

10. The method as claimed in claim 9, further comprising the step of determining an actual vertical height of the vertical wire interconnection by calculating a difference between the height of the vertical wire interconnection and the height of the substrate.

* * * * *